(12) United States Patent
Gupta et al.

(10) Patent No.: US 11,011,354 B2
(45) Date of Patent: May 18, 2021

(54) NON-PERTUBATIVE MEASUREMENTS OF LOW AND NULL MAGNETIC FIELD IN HIGH TEMPERATURE PLASMAS

(71) Applicant: TAE TECHNOLOGIES, INC., Foothill Ranch, CA (US)

(72) Inventors: Deepak K. Gupta, Irvine, CA (US); Richard Ignace, Johnson City, TN (US); Kenneth H. Nordsieck, Madison, WI (US)

(73) Assignee: TAE TECHNOLOGIES, INC.

(*) Notice: Subject to any disclaimer, the term of this patent is extended or adjusted under 35 U.S.C. 154(b) by 0 days.

(21) Appl. No.: 16/204,434

(22) Filed: Nov. 29, 2018

(65) Prior Publication Data
US 2020/0027704 A1 Jan. 23, 2020

Related U.S. Application Data

(63) Continuation of application No. PCT/US2017/035746, filed on Jun. 2, 2017.

(60) Provisional application No. 62/345,571, filed on Jun. 3, 2016.

(51) Int. Cl.
| *H01J 37/32* | (2006.01) |
| *H05H 1/00* | (2006.01) |
| *H05H 1/11* | (2006.01) |
| *G01J 3/02* | (2006.01) |
| *G21B 1/05* | (2006.01) |

(52) U.S. Cl.
CPC ....... *H01J 37/32669* (2013.01); *G01J 3/0224* (2013.01); *H05H 1/0025* (2013.01); *H05H 1/11* (2013.01); *G21B 1/05* (2013.01)

(58) Field of Classification Search
CPC .......... G01J 2003/2826; G01J 3/0224; G01J 3/2823; G01J 3/36; G01J 4/04; G01N 2021/1793; G01N 21/21; G06T 1/005; G06T 2201/0064; G21B 1/05; G21B 1/052; G21B 1/15; G21B 1/23; G21D 7/00; H04N 1/00106; H04N 1/00119; H04N 1/32272; H04N 2201/3235; H04N 2201/3236; H04N 2201/3252; H04N 2201/3253; H04N 2201/3281; H04N 5/23222; H04N 5/23258; H04N 5/44; H04W 48/16; H05H 1/03; H05H 1/10; H05H 1/12; H05H 1/14; H05H 1/16; H05H 1/11; H05H 1/0025; Y02E 30/122; Y02E 30/126; H01J 37/32669
See application file for complete search history.

(56) References Cited

U.S. PATENT DOCUMENTS

| 7,477,718 B2 | 1/2009 | Rostoker et al. | |
| 7,599,062 B2 | 10/2009 | Smith | |
| 9,997,261 B2 | 6/2018 | Tuszewski et al. | |
| 10,019,774 B2 | 8/2018 | Tuszewski et al. | |
| 2005/0156110 A1* | 7/2005 | Crawely | G01J 3/4338 250/338.1 |

(Continued)

OTHER PUBLICATIONS

WO, PCT/US2017/035746 ISR and Written Opinion, dated Mar. 20, 2018.

(Continued)

*Primary Examiner* — Renan Luque
(74) *Attorney, Agent, or Firm* — One LLP

(57) ABSTRACT

Systems and methods that facilitate non-pertubative measurements of low and null magnetic field in high temperature plasmas.

17 Claims, 12 Drawing Sheets

(56) References Cited

U.S. PATENT DOCUMENTS

| | | | | |
|---|---|---|---|---|
| 2014/0125985 A1* | 5/2014 | Justice | ............... | G01J 3/0202 |
| | | | | 356/456 |
| 2014/0300897 A1 | 10/2014 | Treado et al. | | |
| 2018/0328786 A1* | 11/2018 | Lambert | ............... | G01J 3/0248 |
| 2019/0019584 A1* | 1/2019 | Cho | ................... | G02B 27/283 |

OTHER PUBLICATIONS

EP, 17862567.9, Extended Search Report, dated Dec. 12, 2019.
Gota, H., et al., "Internal magnetic field measurement on C-2 field-reversed configuration plasmas", Rev. Sci. Instr., 2012, vol. 83, pp. 10D706-1-10D706-3.

\* cited by examiner

NON-PERTUBATIVE MEASUREMENTS OF LOW AND NULL MAGNETIC FIELD IN HIGH TEMPERATURE PLASMAS

CROSS-REFERENCE TO RELATED APPLICATIONS

The subject application is a continuation of PCT Patent Application No. PCT/US17/35746, filed Jun. 2, 2017, which claims priority to U.S. Provisional Patent Application No. 62/345,571, filed on Jun. 3, 2016, both of which are incorporated by reference herein in their entireties for all purposes.

FIELD

The subject matter described herein relates generally to magnetic diagnostics and, more particularly, to systems and methods that facilitate non-pertubative measurements of low and null magnetic field in high temperature plasmas.

BACKGROUND

High-temperature plasma is essential to achieve nuclear fusion, and hence generation of fusion energy (high-temperature defined as an ion temperature of greater than 100 eV or one (1) million degrees; plasma defined as an ionized gas consisting of positive ions, free electrons and neutrals in proportions resulting in more or less no overall electric charge, typically at very high temperatures (e.g., in stars and nuclear fusion reactors) and/or at low pressures (e.g., in the upper atmosphere and in fluorescent lamps)). High-temperature prohibits the physical contact of any solid material, manmade or natural, to confine or even probe such plasmas without damaging the material itself and severely degrading the quality of the plasma (including temperature itself). High-temperature plasmas are typically confined using magnetic field configurations created by the combination of external magnetic field coils and the current flowing in the plasma. Magnetic confinement keeps the high-temperature plasma away from the wall. This is essential to minimize the contamination and degradation of fusion quality high-temperature plasma. The current flowing in the plasma generates the magnetic fields, hence the net magnetic field amplitude and direction inside the plasma may be substantially different from the magnetic field without the plasma (only due to external coils, known as vacuum field). Measurement of internal magnetic field in fusion grade high-temperature plasma not only provides the valuable information about the plasma confinement and quality, but can also be used as an input for the active feedback control to quickly adjust the magnetic field generated by external field coils for the control of plasma position and instabilities.

High-temperature also poses challenges for experimentally diagnoses inside the plasma (e.g., measurement of local magnetic fields) because insertion of any solid probe into the plasma will not only result in the probe being damaged, but will also degrade the plasma. Diagnostics in these plasmas need to be non-perturbative. As a result, diagnostic techniques based on changes in the property of light, either emitted by plasma itself or injected in the plasma (e.g., laser), are popular in experimental plasma physics.

A quantity beta ($\beta$) is typically defined in plasma physics as a ratio of plasma thermal pressure to the magnetic pressure, representing the balance of forces due to temperature and magnetic field. Low-beta ($\beta \sim 0.1$) high-temperature plasma devices, like Tokamaks and Stellarators, operate at high magnetic fields ($\sim 10^4$ Gauss). In these devices, internal magnetic fields are typical of the order of a kilogauss or higher and hence diagnostic methods based on physics principles of, e.g., Zeeman effect, Faraday rotation, Motional Stark effect, and the like, are used. For these diagnostics, the signal is proportional to the magnetic field strength, and hence it is easier to measure high fields compared to the low fields.

Another popular approach for fusion plasma is using high beta plasma, where the ratio of plasma pressure to magnetic pressure is close to unity ($\beta \sim 1$), for example, Field-Reversed-Configuration (FRC) plasmas and Magnetic-Cusps plasmas. In high-beta plasma configurations, the magnetic field strength is low ($\sim$a few hundred Gauss) and becomes zero inside the plasma. Hence, for such low-beta plasma, the above-mentioned diagnostic methods provide limited or no information. Some researchers have proposed to push the limits of physics and technology of these diagnostics techniques only to be met with limited success. A reliable and proven system and method to measure the null location, field reversal or low magnetic field in high-beta high-temperature plasma is still absent.

High-beta plasma provides an economically attractive approach to fusion due to substantially reduced requirements of magnetic fields. Recent breakthroughs and emergence of high-temperature advanced beam-driven FRC plasmas (see, e.g., WO2013/074666 and WO2015/048092) have made this approach further attractive. It also re-emphasizes the need for an internal magnetic field diagnostic for an FRC plasma (and other high beta plasmas), which is extendable to fusion parameters.

Therefore, it is desirable to provide systems and methods that facilitate non-pertubative measurements of low and null magnetic field in high temperature plasmas.

SUMMARY

The various embodiments provided herein are generally directed to systems and methods that facilitate non-pertubative measurements of low and null magnetic field in high temperature plasmas. An exemplary diagnostic technique is presented herein to measure the low magnetic-field in a high-temperature plasma, including FRCs and magnetic cusps magnetic field configurations. This non-pertubative technique is capable of measuring field reversal, magnetic-field amplitude, spatial profile and direction, but also zero-magnetic-field (null) position and its shape. The real-time measurements of the magnetic field can be used for active feedback control of FRC position and instabilities.

Other systems, methods, features and advantages of the example embodiments will be or will become apparent to one with skill in the art upon examination of the following figures and detailed description.

BRIEF DESCRIPTION OF FIGURES

The details of the example embodiments, including structure and operation, may be gleaned in part by study of the accompanying figures, in which like reference numerals refer to like parts. The components in the figures are not necessarily to scale, emphasis instead being placed upon illustrating the principles of the disclosure. Moreover, all illustrations are intended to convey concepts, where relative sizes, shapes and other detailed attributes may be illustrated schematically rather than literally or precisely.

It should be noted that elements of similar structures or functions are generally represented by like reference numerals for illustrative purpose throughout the figures. It should also be noted that the figures are only intended to facilitate the description of the preferred embodiments.

DETAILED DESCRIPTION

Figure 1A:
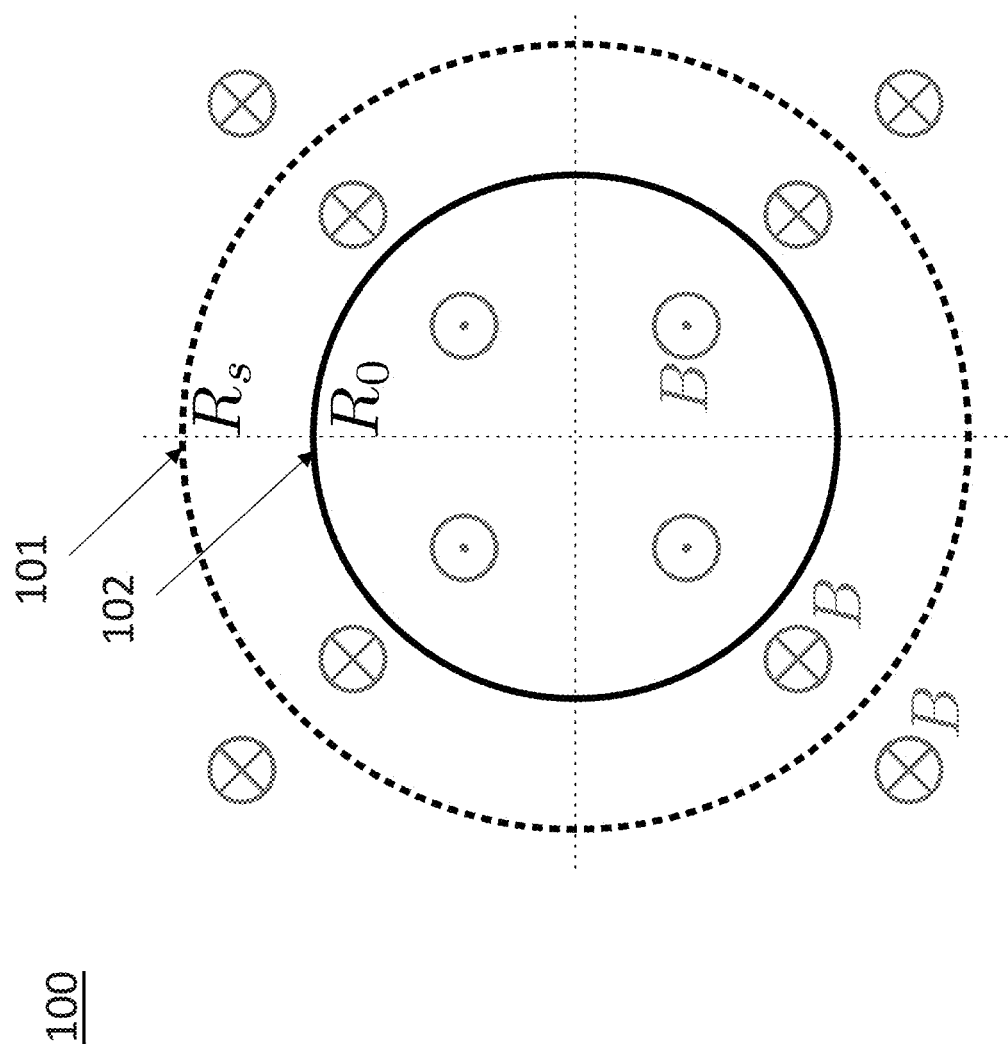
FIG. 1A illustrates an axial view of FRC axial-magnetic fields, $B_z$.

Each of the additional features and teachings disclosed below can be utilized separately or in conjunction with other features and teachings to provide systems and methods that facilitate non-pertubative measurements of low and null magnetic field in high temperature plasmas. Representative examples of the embodiments described herein, which examples utilize many of these additional features and teachings both separately and in combination, will now be described in further detail with reference to the attached drawings. This detailed description is merely intended to teach a person of skill in the art further details for practicing preferred aspects of the present teachings and is not intended to limit the scope of the disclosure. Therefore, combinations of features and steps disclosed in the following detail description may not be necessary to practice the disclosure in the broadest sense, and are instead taught merely to particularly describe representative examples of the present teachings.

Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

The various embodiments provided herein are generally directed to systems and methods that facilitate non-pertubative measurements of low and null magnetic field in high temperature plasmas. An exemplary diagnostic technique is presented herein to measure the low magnetic-field in a high-temperature laboratory plasma, including FRC plasmas and magnetic cusp plasmas. This non-pertubative technique is capable of measuring not only magnetic-field amplitude, spatial profile and direction, but also zero-magnetic-field (null) position and its shape.

The physics phenomenon known as the Hanle effect describes the modification in linear polarization of scattered resonance-line radiation in the presence of a magnetic field. Incident line radiation scattered from an atom (with the total angular momentum of J=1 higher level and J=0 lower level) gets linearly polarized in the absence of magnetic field (e.g., when viewed perpendicular to an incident angle). However, with the application of a magnetic field the scattered light primarily gets depolarize.

From a quantum physics perspective, the Hanle effect is a special case of a level crossing phenomenon at zero magnetic fields. Emitted radiation from degenerated sub-levels is coherent and interferes destructively in one direction to give linearly polarized light. With the application of magnetic fields, degeneracy is lifted with the separation of Zeeman sub-levels by an amount greater than their natural width, which leads to the depolarization of scattered light.

The presence of a polarized Hanle signal in magnetically confined plasmas, e.g. an FRC plasma or cusp plasma, may itself suggest the presence of a near zero-magnetic-field or null position. With spatially resolved measurements, e.g. imaging or multiple-chord views, the radial location of the null and its shape, along with the magnetic field profile, may be obtained. A 2-D imaging of a Stokes vector may be deployed to have full polarization details with spatial resolution. The Stokes vector is the formulation developed by Stokes in 1852 to mathematically handle the polarization of light and can be directly measured.

The Hanle effect modifies the linear polarization of scattered resonance-line radiation in the presence of a magnetic field. Line radiation from the main plasma ions or impurity ions may be used for measurement as long as it satisfies the transition conditions for the Hanle effect.

In FRC plasmas, charge states of different elements have different radial profiles due to their dependence on electron temperature (Te) and density (ne) radial profiles. A charge state needs to be selected that is present in the low field region at or near the null, which is typically in a high Te and ne region. In addition, the selection of level should be such that a fluorescence line can be excited using the external light source, typically a laser.

Known impurities may be added to the plasma to provide a Hanle line that can be excited as fluorescence with a laser. Adding impurities may also provide an option to choose a line for which a laser is available. An example of this is the injection of Neon or Helium-Neon mixture, which provides levels that can be excited with commercially available He—Ne lasers.

For the specific application of FRC plasmas, to measure the axial magnetic field and the position of null location, external radiation (e.g., a laser) illuminates the plasma from the radial direction. The scattered resonance light signal may be observed at a perpendicular view in radial or axial directions. Observed linear-polarization of the signal will peak only at the locations where incident light and null location intersects, providing the position of the null location. Similar to the example above, fraction of polarization will provide the magnetic field strength, etc.

In an FRC plasma, the null location is away from the center, and hence the light radiation from FRC illuminates the null asymmetrically. Self-illumination may be sufficient to provide the scattered resonance signal near null and hence eliminate the need for an external illumination source completely. Imaging of peak scattered resonance polarized signals with this self-illumination scheme, in addition, will provide the shape (or image) of null field and hence information about the wobble mode and rotational instabilities. Using a radial view, the FRC plasma length can also be measured by measuring the distance between the locations of polarized signal from the two x-point cusps along the length of the FRC plasma.

In one example, a scattered signal from plasma atoms may be collected in the perpendicular direction of the incident external light on the plasma. The observed scattered resonance signal will be fully linearly polarized in absence of a magnetic field. However, with the increase of the magnetic field, a fraction of polarization will decrease and completely vanish at higher magnetic field. The range of magnetic field sensitivity will depend upon the radiation rate of the selected line-radiation of the plasma atom. Change in the angle of polarization will provide direction of the magnetic field. Spatial measurements or imaging of peak polarization will provide the location of zero-magnetic-field (null) position and its shape.

In the core region of plasma where the magnetic field is typically low and the null field exists, electron temperature is high and hence the presence of hydrogen neutrals is usually not possible in the region of high electron temperature due to their low ionization energy. However, recently, advanced beam-driven FRC plasmas were created with the injection of high-energy neutral (hydrogen) beams (see, e.g., WO2013/074666 and WO2015/048092). Injected neutral beams in FRC plasmas not only provide high-energy beam neutrals (7-20 keV), but also the warm-temperature (~0.5-1 keV) hydrogen neutrals in the core region of plasma, due to charge-exchanged with plasma ions. The radiation from these (warm and high-energy) excited neutrals may be used to measure the Hanle effect.

Moreover, charge exchange processes with fully and partially ionize impurities also provide the charge states and transitions that typically have lower chance or not at all present in high-temperature plasma. As an example, high power laser diodes are available at and near Balmer-alpha line (656.1 nm) that can be used to excite fluorescence signal from hydrogen neutrals in the high temperate core. In addition, modulated hydrogen neutral beams may also be exploited for further control and enhancement of the measurements.

In cases where a large background Hanle line signal is also present, in addition to a laser, due to excited by electron-impact, the laser excitation signal can be separated from the large background by chopping or modulating the laser beam. Lasers are a good choice for the illumination source due to their directionally, low dispersion, narrow spectral width and available high intensity. Although a large variety of fixed wavelength and tunable lasers are available in the market, it is not always possible or economical to have a laser at the desired wavelength. Hence selection and laser line, as well as Hanle line, need to be done simultaneously. Two-photon fluorescence may also be considered for Hanle signal.

With high collisions, absorption and emission processes become uncorrelated, which depolarize the scattered light and destroy quantum interference of Hanle effect, even in the absence of magnetic field. For typical FRC plasmas (with $n_e \sim 10^{13}$ cm$^{-3}$; Te~100 eV) the electron-ion collision frequency is ~$10^5$ s$^{-1}$, which is orders of magnitude smaller than the typical radiative rates (or Einstein coefficients), A~$10^8$ s$^{-1}$, implying that the depolarization due to collision can be ignored. For the high-density plasma, collisional broadening of the Hanle signal may need to be accounted for mainly accurately measuring the amplitude of the low magnetic field.

Figure 1B:
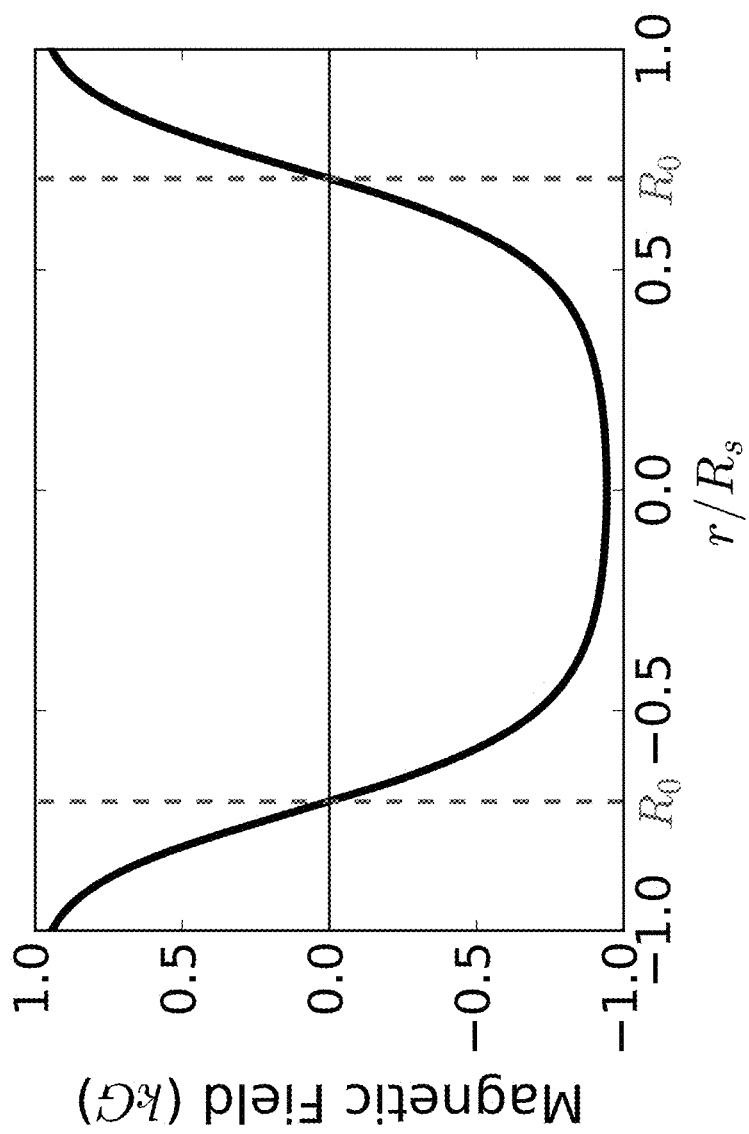
FIG. 1B illustrates a theoretical axial-magnetic field, $B_z$, profile for an FRC magnetic field configuration.

FIG. 1A illustrates an axial view of an FRC axial-magnetic field ($B_z$) 100. FIG. 1B illustrates a theoretical axial-magnetic field ($B_z$) profile for an FRC plasma. In an FRC plasma, along the radial direction, the magnetic field 100 is highest close to the last closed flux surface, (Rs), also known as the FRC plasma radius 101. The axial magnetic field ($B_z$) 100 decreases gradually inside the FRC plasma and vanishes at the null location ($R_0$) 102. Inside the null radius 102, the magnitude of the axial magnetic field 100 increases in the opposite direction compared to outside the null, and peaks at the center of the FRC plasma. Oppositely directed inner and outer field lines connect at some axial distance (called X-point), defining the FRC plasma length.

Figure 2:
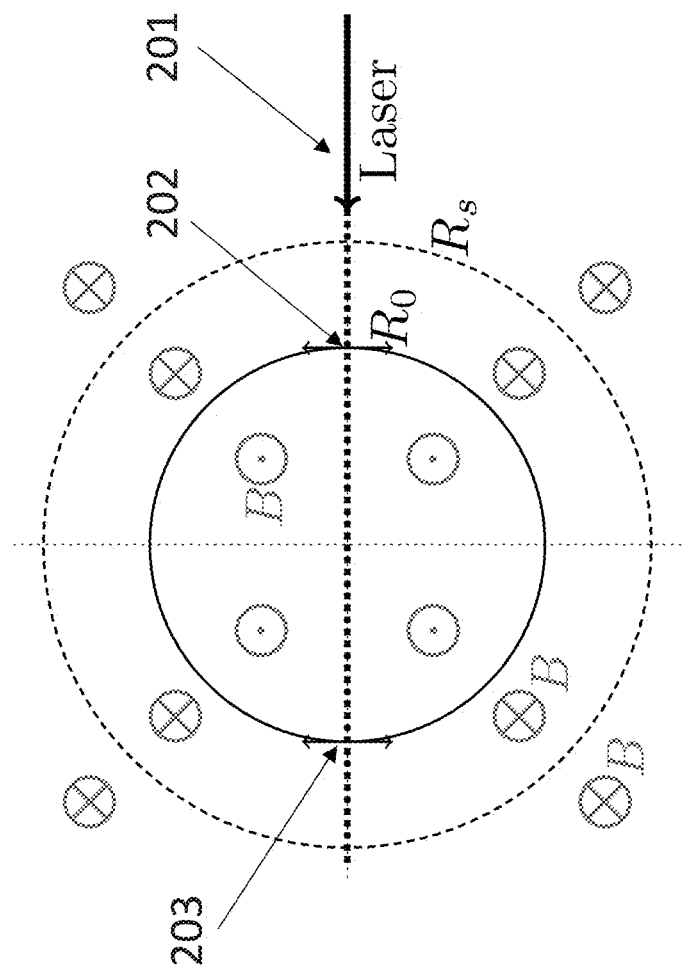
FIG. 2 illustrates an axial view of FRC axial magnetic field $B_z$ with an externally illuminated light source.

FIG. 2 illustrates an axial view of FRC axial magnetic field ($B_z$) 200 with an externally illuminated light source. In an exemplary diagnostic setup, an intense light source 201, e.g. a laser, of a selected wavelength is injected radially in the FRC magnetic fields, crossing the radially varying axial magnetic field 200, including the null locations 202, 203. The resonant-line scattered light is collected with an axial view. Owing to the Hanle effect, linearly polarized signals only at and near the null location will be observed, providing the radial position of the null 202, 203. For this simple geometry of light illumination and collection, degree of polarization equation may be written as, $$p_L = \frac{1}{\sqrt{1+4H^2}} \quad (1)$$

where $H=\omega_L/A$ is the ratio Larmor frequency of bound electron and Einstein's coefficient or radiation rate of the ion. The measurement of the degree of polarization provides the value of Larmor frequency, which is also a function of magnetic field. H is effectively proportional to the ratio of magnetic field to the Einstein's radiation coefficient. This allows measurement of a low magnetic field.

Figure 4:
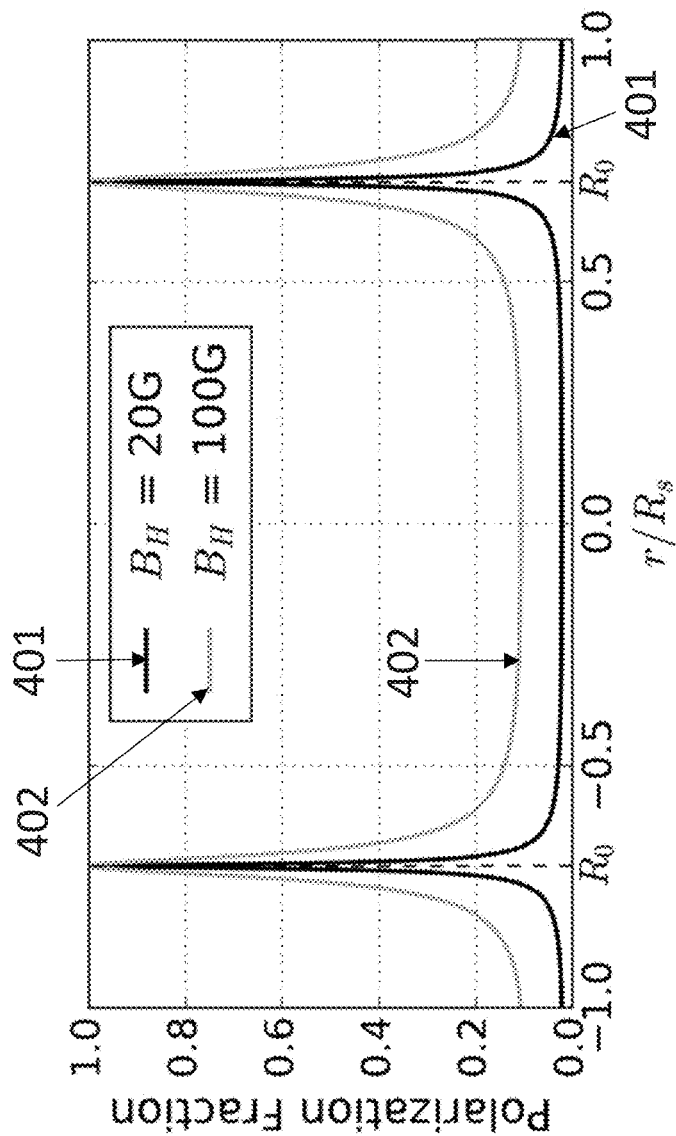
FIG. 4 illustrates an exemplary polarization fraction due to Hanle effect along field axial FRC plasmas.

FIG. 4 illustrates an exemplary polarization fraction due to Hanle effect along field axial FRC plasmas. The variation is shown in FIG. 4 of polarization fraction along the radius of the FRC axial magnetic field 100 given in FIG. 1B. The polarization signal only peaks at the magnetic null location. This can provide the location of null field for the spatially resolved measurements. In FIG. 4, the polarization fraction is shown for $B_H$=20 G 401 and $B_H$=100 G 402.

In addition, the direction of polarization also rotates with respect to zero field polarization by an angle, $\alpha$=0.5 tan$^{-1}$(2H), which provides the direction of the magnetic field. The direction of the magnetic field can be measured even at high fields where the Hanle signal given by Equation (1) gets saturated. This provides a unique capability to the method where the existence of field reversal can be confirmed by taking measurements at two spatial locations, each on either side of tentative null location, irrespective of the field strength at the measurement locations. In an FRC magnetic field, a measurement near the center of the machine and other near the edge can provide the confirmation about the field reversal.

Figure 3:
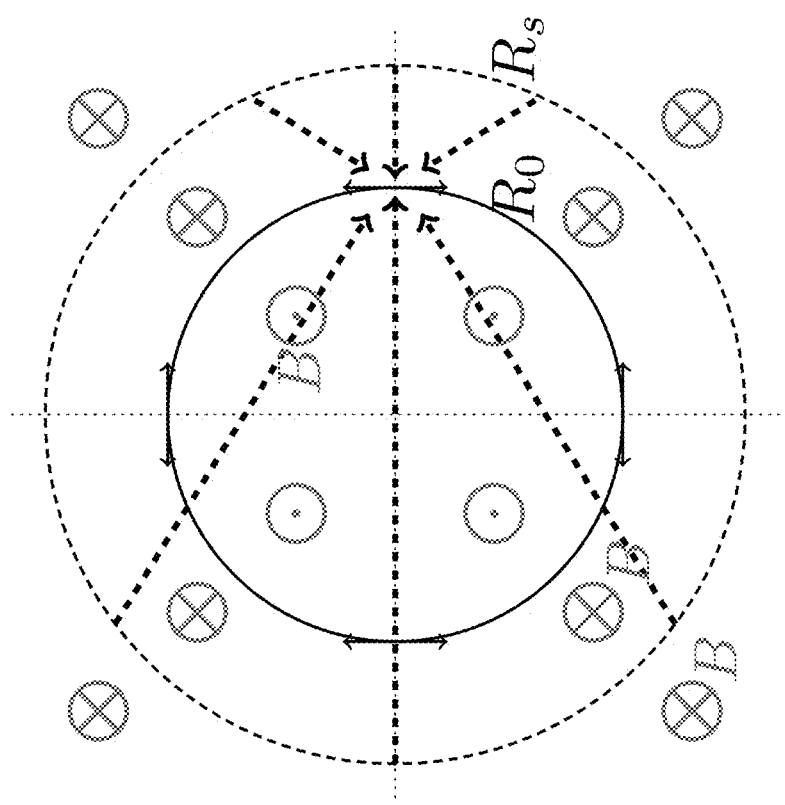
FIG. 3 illustrates an axial view of FRC axial magnetic field $B_z$ with self-illumination.

FIG. 3 illustrates an axial view of FRC axial magnetic field $B_z$ 300 with self-illumination. For the axial view, that is the observation or signal collection port is along the axial direction of the FRC axial magnetic field 300, an FRC axial magnetic field 300 can be viewed as a circular structure as shown in FIG. 3.

In FRC magnetic fields, with circular symmetry, every location, except for the center of the FRC magnetic field, receives anisotropic incident radiation from the FRC plasma itself. This is true for all impurities and main ion line-radiation due to their azimuthally symmetric distribution. This asymmetric illumination may be sufficient for the observation of the Hanle effect without the need of an external illumination source. Moreover, instead of only two locations on the null being observable with the use of an external source, polarization signals will peak along the whole null-location circle, with the polarization in azimuthal direction. This provides the possibility of imaging the whole null-location circle simultaneously, and hence a direct measurement of FRC plasma center location and shape, based on the internal magnetic structure. With time varying signals this will provide valuable information about the n=1 wobble mode and n=2 rotational instabilities.

For the axial geometry of light collection, the degree of polarization equation may be written as Equation (1) above. The measurement of the degree of polarization provides the value of Larmor frequency, which is also a function of magnetic field. H is effectively proportional to the ratio of the magnetic field to the Einstein's radiation coefficient. This allows measurement of a low magnetic field. FIG. 4 shows the variation of polarization fraction along the radius of the FRC axial magnetic field 100 given in FIG. 1B. The polarization signal only peaks at the magnetic null location. This can provide the location of null field for the spatially resolved measurements.

In addition, the direction of polarization also rotates with respect to zero field polarization by an angle, $\alpha = 0.5 \tan^{-1}(2H)$, which provides the direction of the magnetic field. The direction of the magnetic field can be measured even at high fields where the Hanle signal given by Equation (1) gets saturated. This provides a unique capability to the method where the existence of field reversal can be confirmed by taking measurements at two spatial locations, each on either side of tentative null location, irrespective of the field strength at the measurement locations. In an FRC magnetic field, a measurement near the center of the machine and another near the edge can provide the confirmation about the field reversal.

Figure 5:
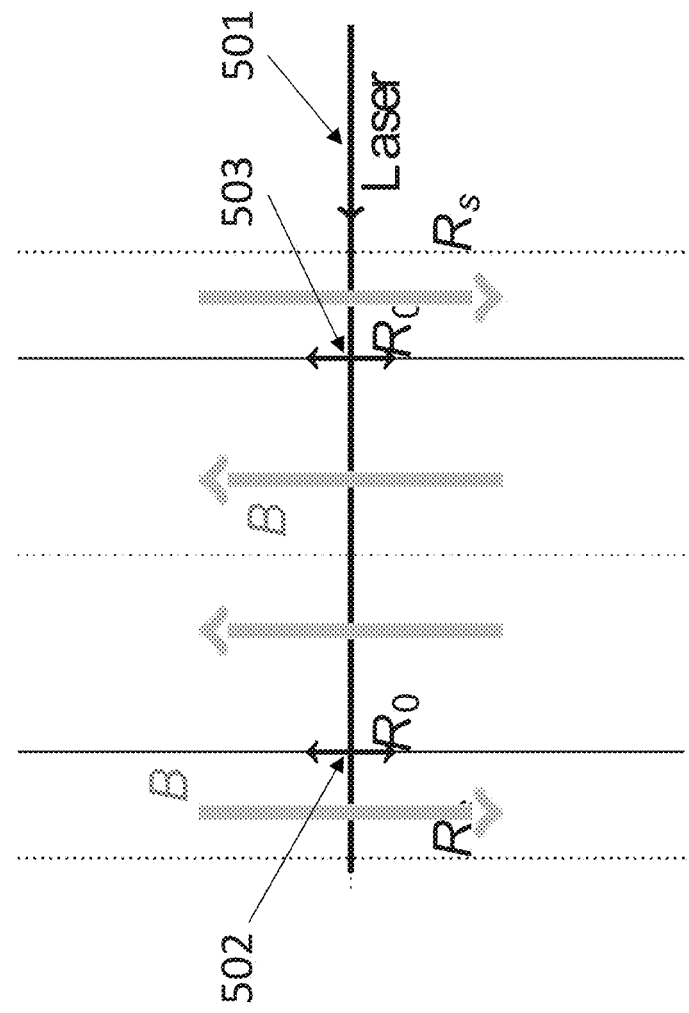
FIG. 5 illustrates an exemplary radial view of axial magnetic field $B_z$ with external illumination.

FIG. 5 illustrates an exemplary radial view of FRC axial magnetic field $B_z$ 500 with external illumination. Axial views in a linear FRC plasma machine are not always, or at least easily, available. Many times, the preferred (or only) option for diagnostics is observing the signal from a radial view. For such situations (with an external illumination 501, e.g., a laser, incident from the radial direction) observation views perpendicular to the incident radiation direction in the same radial plane may be chosen as shown in FIG. 5. In this arrangement, the magnetic field is directed perpendicular to the scattering (or observation) plane. For this diagnostic geometry, instead of Equation (1) the fractional linear polarization is given by the equation, $$p_L = \frac{1+2H^2}{1+6H^2} \quad (2)$$

Here, the range of change in polarization is only two-thirds, compared to the axial views observation cases (Equation (1)). However, no change in the direction of linear polarization occurs, and position of zero field null 502, 503 can still be found with the equally good spatial resolution.

Figure 6:
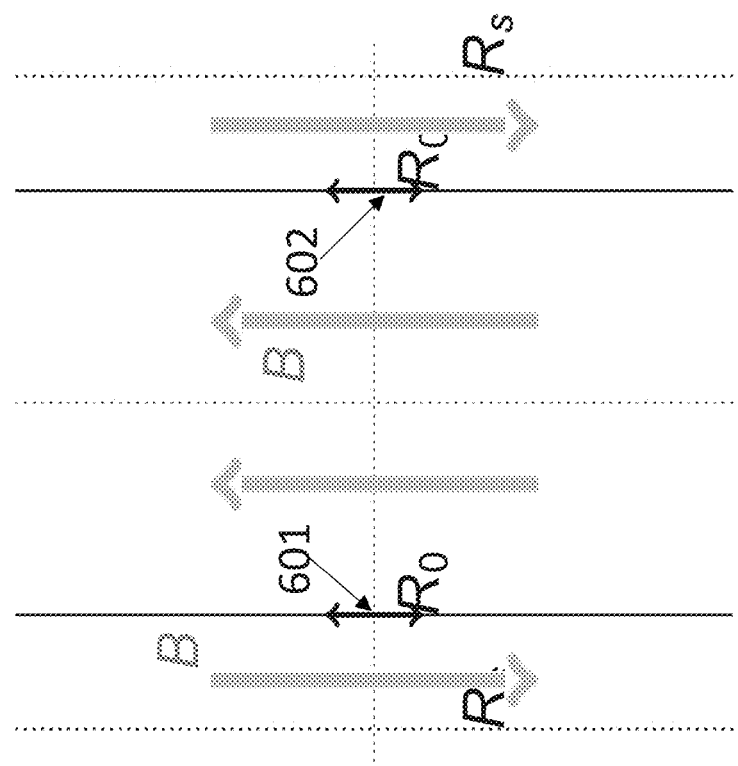
FIG. 6 illustrates an exemplary radial view of axial magnetic field $B_z$ with self-illumination.

FIG. 6 illustrates an exemplary radial view of axial magnetic field $B_z$ 600 with self-illumination. Axial views in a linear FRC plasma machine are not always, or at least easily, available. Many times, the preferred (or only) option for diagnostics is observing the signal from a radial view. For such situations observation views in the radial plane may be chosen. In this arrangement, the magnetic field is directed perpendicular to the scattering (or observation) plane. For this view, the range of change in polarization is low, compared to the axial view observation cases (Equation (1)). However, no change in the direction of linear polarization occurs, and signal still peaks at the field null locations 601, 602. The position of zero field null can still be found with good spatial resolution.

Figure 7:
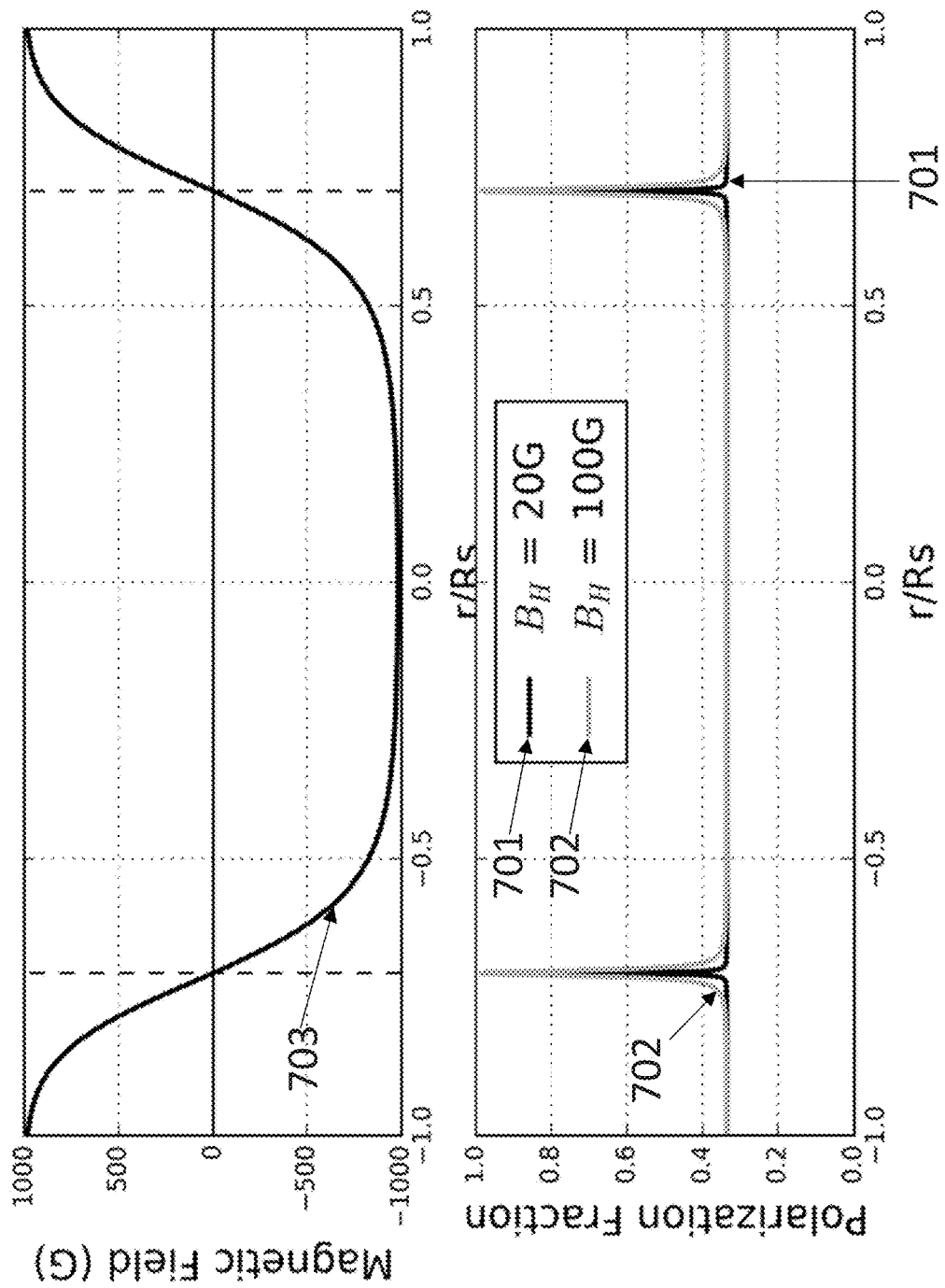
FIG. 7 illustrates an exemplary polarization fraction with radial view.

FIG. 7 shows an exemplary polarization signal profile for exemplary radial view case with external illumination. Shown are polarization fractions for $B_H=20$ G 701 and $B_H=100$ G 702, as well as magnetic field 703.

For the theoretical estimation of a Hanle signal for a given geometry of light illumination, scatted light collection, and the magnetic field, the Hanle phase matrix is calculated. The phase matrix then can be used for the estimation of Stokes vectors, which in turn provide the theoretical estimation of the fractional polarization, rotational angle, and other parameters. Experimentally, measuring the various components of polarized light and combing the components can provide the Stokes vectors, which can be used to compare with theatrical inferences, and provide the desired information about the magnetic field. Typically, various components of polarization are collected using a birefringent crystal or polarization plates.

Figure 8:
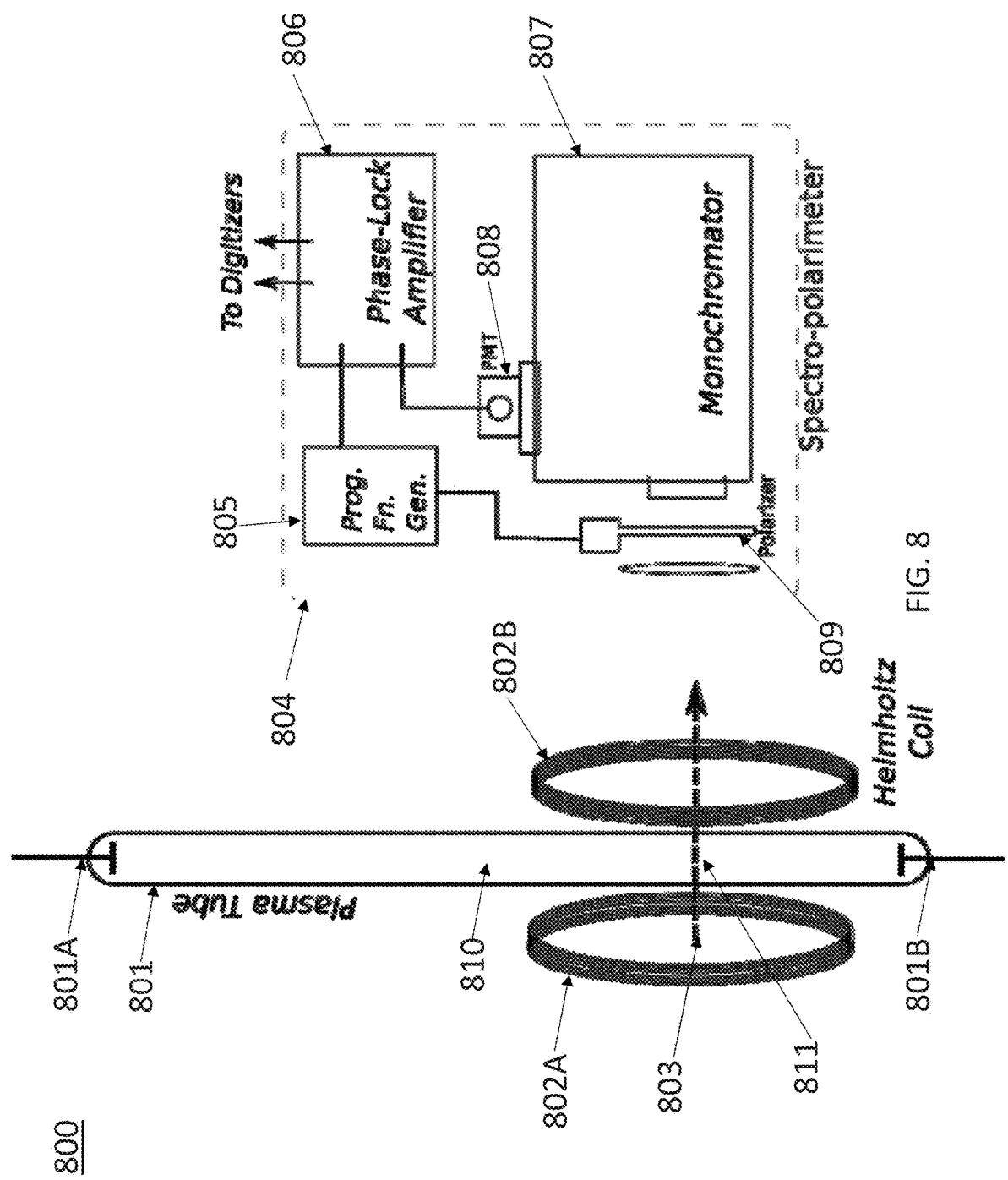
FIG. 8 illustrates an exemplary measurement system schematic for use with embodiments of the present disclosure.

FIG. 8 illustrates an exemplary measurement system schematic 800 for use with embodiments of the present disclosure. As shown in FIG. 8, a DC plasma 810 is created in a plasma tube 801 having a proximal end electrode 810A and a distal end electrode 801B, and a length of around 20 inches. The plasma 810 is created using Neon gas at around 2 Torr. A Helmholtz coil 802A, 802B, located close to one end (e.g., the distal end 801B) of the tube 801, is used to create the magnetic field in the direction shown by arrow 803. The light signal is collected from the small volume of plasma 811 located under the Helmholtz coil 802A, 802B and subject to the magnetic field. The remainder of the plasma 810 in the tube serves as the source to illuminate the plasma 811 under the Helmholtz coil 802A, 802B. Although multiple lines from Neon are available which shows the Hanle effect, a monochromator 807 is used to separate the 626.6 nm line for the measurements. The 626.6 nm line emits directly from plasma (due to electron excitation) and also has a Hanle signal due to resonance scattering. Having the same wavelength light scattered, the Hanle signal, along with large background directly from the plasma makes the Hanle detection challenging. Signal separation is achieved by using a phase lock amplifier 806 coupled with a rotating polarizer 809. Light from plasma 811 passes through the rotating polarizer 809 before entering the monochromator 807. The monochromator 807 measures the Stokes vectors or components of polarization. Signals from the phase lock amplifier 806 are digitized for further analysis and plotting. A collection of the hardware used here is effectively working as a spectropolarimeter 804, which can provide polarization components or Stokes vector of spectrally resolved line. There are multiple ways to make a spectropolarimeter 804 depending upon the requirements. Spectropolarimeter 804 also comprises a PMT module 808 and a program function generator 805.

Figure 9:
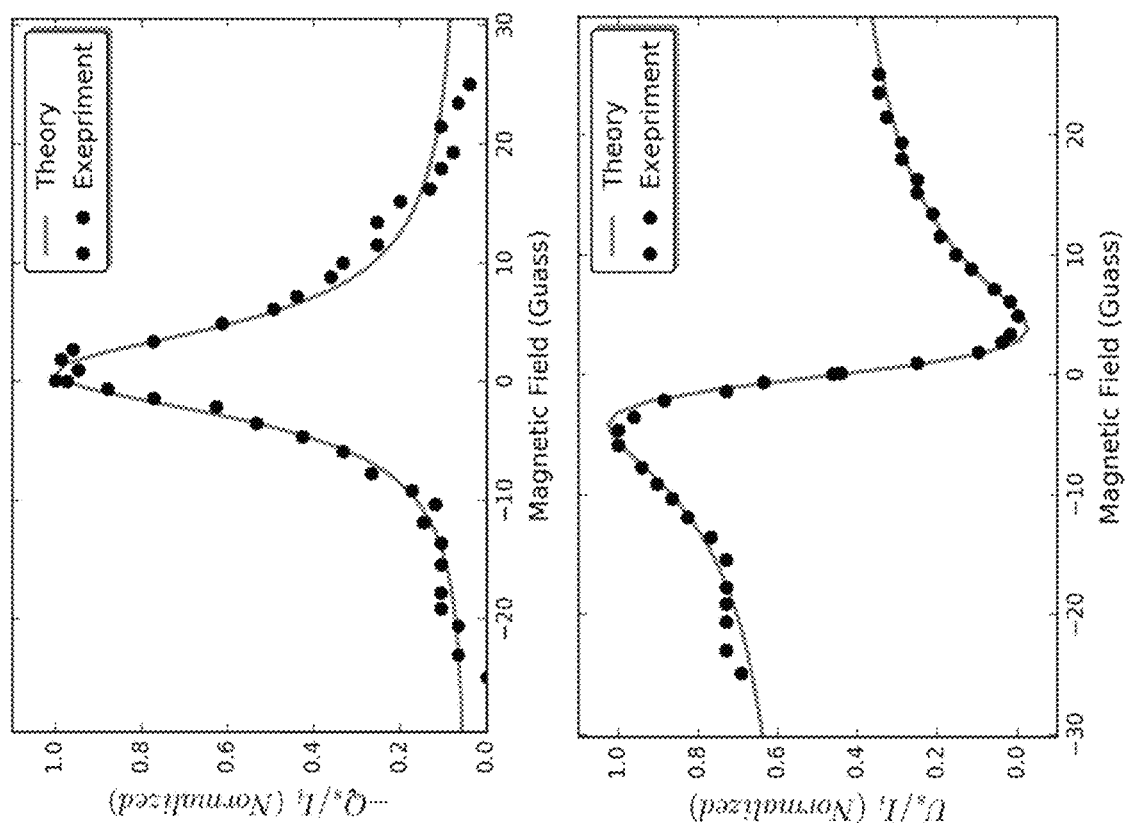
FIG. 9 illustrates a comparison of measured and theoretical Stokes vector signals (Q and U) with the change in magnetic field, according to embodiments of the present disclosure.

FIG. 9 illustrates a comparison of measured and theoretical Stokes vector signals (Q and U) with a change in magnetic field, according to embodiments of the present disclosure. In embodiments, a separate illumination source (e.g., a laser) is not used to illuminate part of plasma in the investigation. Light emitted by the plasma along the length of the tube itself illuminates the part of plasma under the Helmholtz coil from where the signal is collected. Hence, the geometry (or length) of the tube with respect to field direction provides the direction of illumination. FIG. 9 shows the two stokes parameters, Q and U, normalized to the intensity of signal I, for the magnetic field case where the magnetic field is aligned along the viewing direction and perpendicular to the illumination direction (or the length of tube). The magnetic field is varied from positive to the negative direction to collect the signals. FIG. 9 also shows the theoretical data over plotted with the experimental curve, showing a good agreement between both. As it can be seen that the vector component Q peaks and vector U goes to zero at the zero magnetic field, hence shows the capability to provide the information about the location of field null in an FRC magnetic field. For low field, e.g., 20 Gauss or less, field strength can also be estimated using these vectors. Asymmetry of vector U for the direction of the magnetic field allows measurements of the direction of magnetic field. The ratio of vectors U and Q provide the change in polarization angle, which in turn provide the direction of magnetic field.

A small azimuthal magnetic field (Be) may be present in the FRC magnetic fields. Knowledge of this azimuthal field is also highly desirable. Methods described above can be extended to provide three-dimensional vector components of the magnetic field. It may be achieved, (i) by using, multiple, near orthogonal views, for the same volume of plasma, (ii) or by using two or more resonance radiation-lines with different sensitivities (e.g., H~1 and H>>1). The former method of using multiple views is practically difficult due to lack of accessibility of proper views in a fusion scale plasma device. Later methods require finding the multiple Hanle lines in addition to somewhat complex theoretical treatment. However, the theoretical problem gets simplified if the polarization of illuminating light can be controlled. Such techniques can provide the measurement of both axial and azimuthal magnetic field simultaneously in an FRC plasma.

Figure 10:
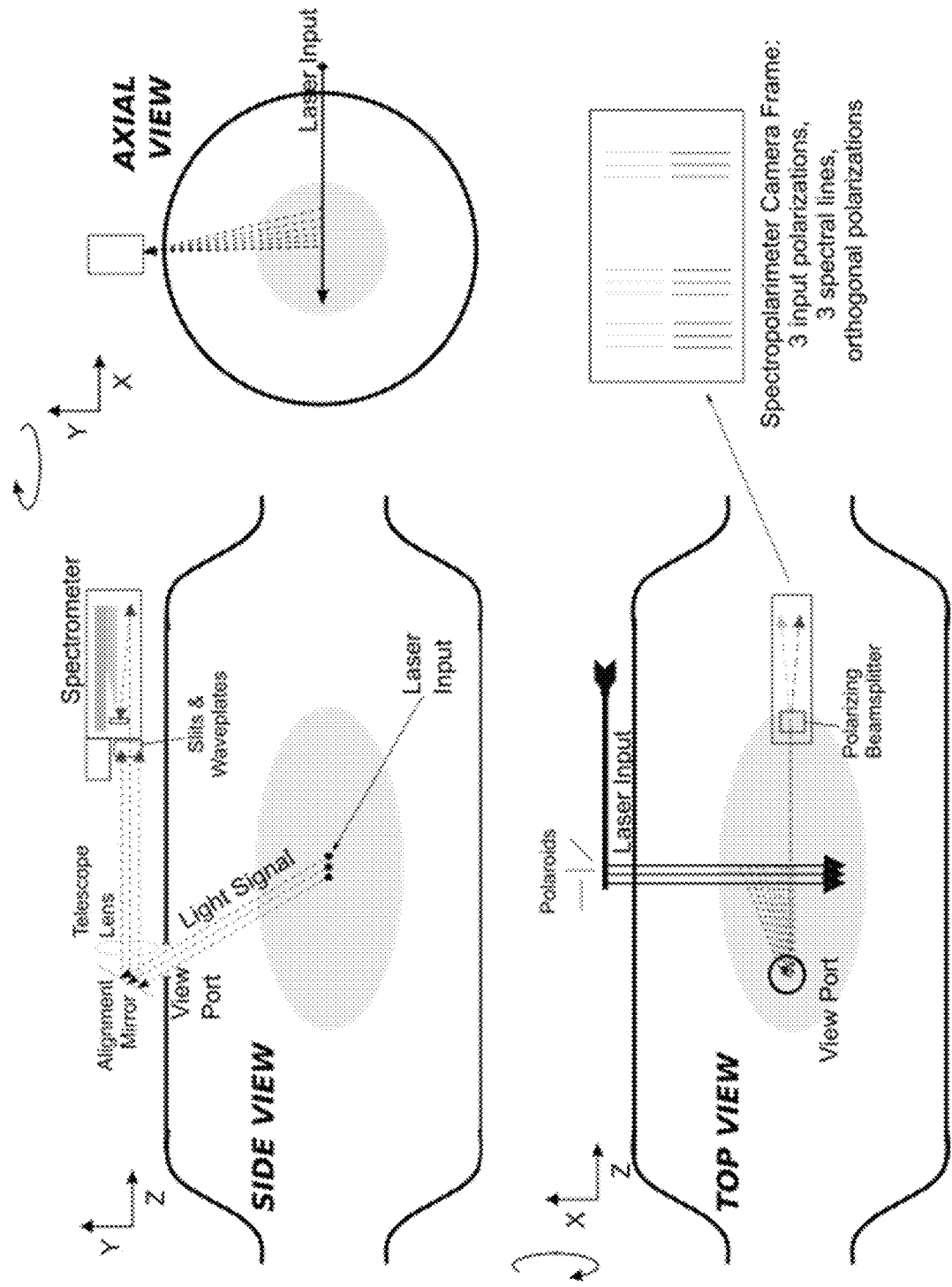
FIG. 10 illustrates a system comprising a spectro-polarimeter, according to externally illuminated embodiments of the present disclosure.
Figure 11:
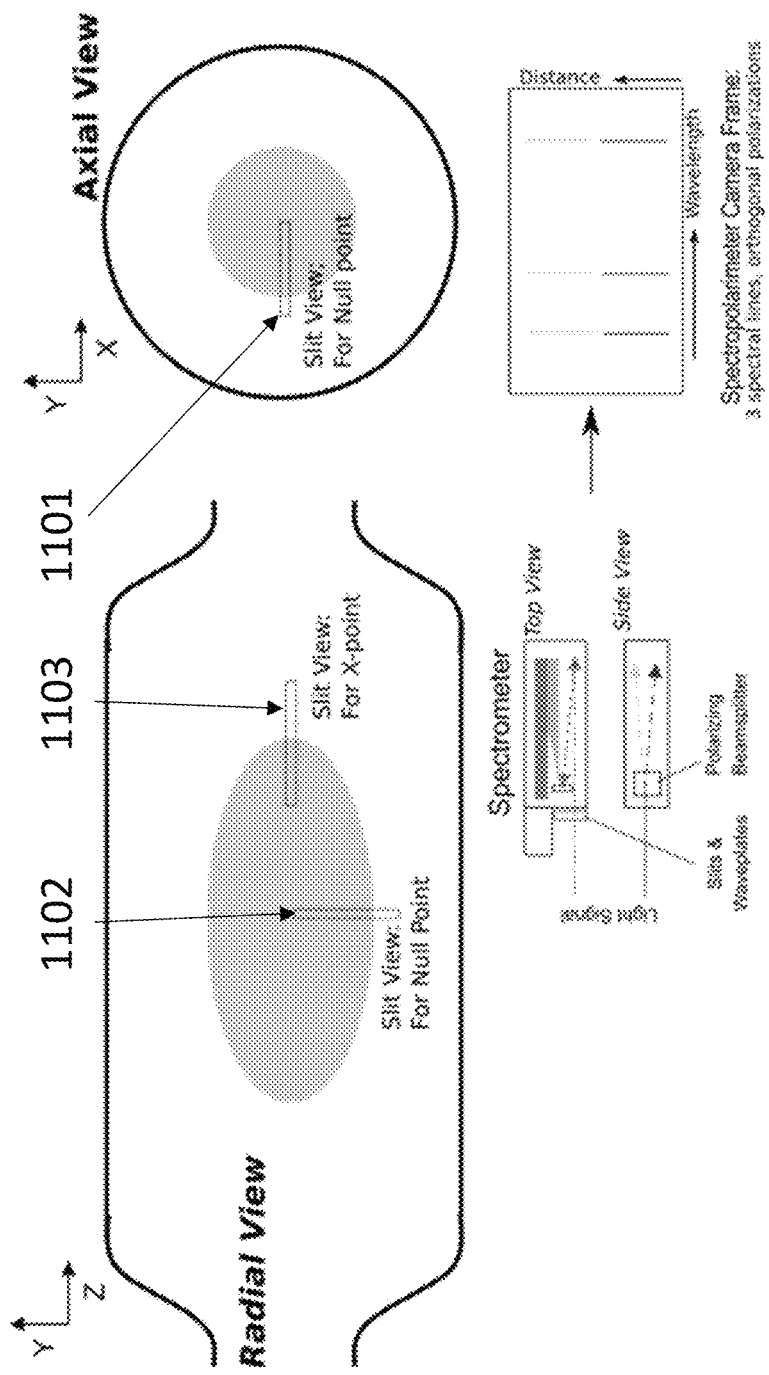
FIG. 11 illustrates a system comprising a spectro-polarimeter, according to self-illuminated embodiments of the present disclosure.

In embodiments, instrumentation for high-temperature FRC plasma comprises an instrument for providing the following measurements for a high temperature FRC plasma:
  Proof of the existence of field reversal and its time evolution
  Radial location of field null and its time evolution
  Spatial profile of the vector field direction of the net magnetic field and its time evolution
  Each of these measurements and more can be achieved by the system and methods described herein. FIGS. 10 and 11 illustrate a design of a spectropolarimeter and its intended implementation on a FRC plasma device.

FIG. 10 illustrates a system comprising a spectro-polarimeter, according to externally illuminated embodiments of the present disclosure. A spectrometer with fast imaging CCD camera is modified to make a spectropolarimeter. As usual, the wavelength is imaged along the horizontal axis direction of the CCD. The spectral span is wide enough to incorporate multiple wavelengths those need to be measured simultaneously for the vector field measurements. Radial extent of the plasma that includes field null, is imaged along the vertical direction of a CCD. The light in the vertical direction is further split in orthogonal polarizations using a birefringent crystal or similar property material/component.

Three laser beams with different polarization and separated by a small distance from each other, otherwise same wavelength and other properties, are injected radially in the FRC plasma, e.g., from the side. The spectopolarimeter may also have three slits to image these three lasers beams. Each slit and laser combination will provide its own spectral line, separated by the other two. The injected laser beams intersect the null location in an FRC magnetic field at two locations. The paths of these beams, along the radial direction, are imaged in the vertical direction of the CCD with the required spatial resolution. The spectropolarimeter provides the combination of three input polarizations: two orthogonal polarizations and three or more spectral lines, with 1d spatial resolution along the radial direction. The fast frame camera provides the measurements with required time resolution.

In addition to null location, another point where a magnetic field vanishes in an FRC plasma is the X-point near the edges of the FRC along the axial direction. The distance between the X-point defines the length of FRC. Methods presented herein measure the X point locations, and length of FRC. In an FRC, the length may shrink with time. This makes it difficult to use a single laser beam injected radially and located at a fixed axial location to illuminate the X-point. In embodiments, a laser beam is injected axially so that it can illuminate both the X point simultaneously, and continues to be illuminated during the shrinking of the FRC magnetic field. An alternate approach for illumination may include the use of multiple lasers or sheets of laser injected radially. In either case, a radial view, perpendicular to the injected laser and similar to the radial view described above, can be used to collect the signal.

FIG. 11 illustrates a system comprising a spectro-polarimeter, according to self-illuminated embodiments of the present disclosure. A spectrometer with fast imaging CCD camera is modified to make a spectro-polarimeter. As usual, the wavelength is imaged along the horizontal axis direction of the CCD. The spectral span is wide enough to incorporate multiple wavelengths that need to be measured simultaneously for the vector field measurements. Radial extent of the plasma that includes field null is imaged along the vertical direction of a CCD. The light in the vertical direction is further split into orthogonal polarizations using a birefringent crystal or similar property material/component. The instrument can provide the combination two orthogonal polarizations and multiple spectral lines, with 1d spatial resolution along the radial direction. The fast frame camera can provide the measurements with required time resolution. The signal can be collected with an axial or radial view of the FRC magnetic field. The spectrometer slit needs to be imaged on the plasma at an appropriate location and direction to collect the signal. For an axial view, the slit 1101 will be aligned along the radial covering all possible locations of the null. For a radial view, the slit 1102 will also be aligned along the radial direction.

In addition to null location, another point where the magnetic field vanishes in an FRC plasma is the X-points near the edges of the FRC plasma along the axial direction. The distance between the X-point defines the length of the FRC plasma. Methods presented in the invention can also be used to measure the X point locations, and length of FRC plasma. A radial view provides a simplest geometry to observe the X point. A spectropolarimeter, similar to the one described herein may be used. The 1d spatially resolved direction (i.e., length of the slit view 1103) should be aligned toward the axial direction of the FRC plasma that includes the X-point region. As the FRC plasma length shrinks with time, the X-point will move toward the FRC plasma midplane. One spectropolarimeter will allow for measuring of the location of one X point, hence two simultaneous measurements are needed to measure the distance between two X points and hence the length of the FRC plasma.

Systems and methods provided herein provide inputs for the real-time feedback control of the FRC plasma. The system and methods herein provide the radial as well as axial position of the FRC plasma in the real time, which can be directly used for feedback control. For example, a fast frame camera used with the above configuration can provide locations of magnetic null at two points on a chord, say along the diameter. With simple algebra, this information can be used to specify the radius and center of the FRC plasma in the real time using the computer or even analog or digital signal processing. (e. g., center of these null will specify the center of the plasma.) This real-time information can be provided to a feedback control system to control its radial location and size, by controlling the externally applied magnetic field. If measurements of X-points or length of FRC plasma is available, these can also be provided to the feedback system to control axial location of FRC plasma.

The Stokes vectors Q, U, and V may be directly fed to the feedback system. This may provide the capability to make the automated control decision based on the existence of field reversal, the location of field null and even direction or component of a magnetic field in the FRC plasma.

In a plasma based fusion reactor, it is critical to have basic measurements and control of plasma for operation and safety. Systems and methods described herein provide non-perturbative measurements of the magnetic configuration and positions, and can be used for the active control in FRC plasma based fusion reactor.

Embodiments of the present disclosure are directed to a non-perturbative method of measuring magnetic fields in high-temperature plasmas, comprising radially injecting a first plurality of laser beams into an FRC plasma, wherein each of the laser beams has a different polarization, intersecting a null location in a FRC magnetic field of the FRC plasma at two locations; imaging paths of the first plurality of laser beams in a vertical direction of a CCD; splitting light in the vertical direction is further split in orthogonal polarizations using a birefringent crystal; and measuring the null location of the FRC magnetic field.

In embodiments, the method further comprises axially injecting a laser beam into the FRC magnetic field; illuminating each of two X-points of the FRC magnetic field; and measuring a distance between the two X-points to produce a length of the FRC magnetic field.

In embodiments, the method further comprises radially injecting a second plurality of lasers into the FRC magnetic field; illuminating each of two X-points of the FRC magnetic field; and measuring a distance between the two X-points to produce a length of the FRC magnetic field.

In embodiments, the method further comprises providing locations of the null location of the FRC magnetic field at two points along a diameter of the FRC plasma; calculating, using the locations of the null location, a radius and center of the FRC plasma; and providing the radius and center to a feedback control system.

In some embodiments, the feedback control system controls a radial location and size of the FRC plasma by controlling the externally applied magnetic field.

Embodiments of the present disclosure are also directed to a non-perturbative method of measuring magnetic fields in high-temperature plasmas, comprising imaging a wavelength of an FRC plasma along a horizontal axis direction of a CCD; imaging a radial extent of the FRC plasma along a vertical axis direction of the CCD; splitting light in the vertical direction into orthogonal polarizations using a birefringent crystal; and measuring a null location of an FRC magnetic field of the FRC plasma.

In embodiments, the method further comprises aligning a slit of a first spectropolarimeter toward an axial direction of the FRC plasma; and measuring a location of a first X-point of the FRC magnetic field.

In embodiments, the method further comprises simultaneously aligning a slit of a second spectropolarimeter toward an axial direction of the FRC plasma; measuring a location of a second X-point of the FRC magnetic field; and measuring a distance between the first X-point and the second X-point to produce a length of the FRC magnetic field.

In embodiments, the method further comprises providing locations of the null location of the FRC magnetic field at two points along a diameter of the FRC plasma; calculating, using the locations of the null location, a radius and center of the FRC plasma; and providing the radius and center to a feedback control system.

In embodiments, the feedback control system controls a radial location and size of the FRC plasma by controlling the externally applied magnetic field.

Embodiments of the present disclosure are directed to a spectro-polarimeter for non-perturbative measuring of magnetic fields in high-temperature plasmas, comprising: a spectrometer; a fast imaging CCD camera; three laser beams; and a birefringent crystal.

In embodiments, the three laser beams have different polarizations, similar wavelengths, and are separated by a small distance from each other.

In embodiments, the spectro-polarimeter further comprises three slits to image the three lasers beams.

In embodiments, the spectro-polarimeter is configured to: radially inject the three laser beams into an FRC plasma, intersect a null location in a FRC magnetic field of the FRC plasma at two locations; image paths of the first plurality of laser beams in a vertical direction of a CCD; split light in the vertical direction is further split in orthogonal polarizations using the birefringent crystal; and measure, using the CCD, the null location of the FRC magnetic field.

In embodiments, the spectro-polarimeter is further configured to: axially inject a laser beam into the FRC magnetic field; illuminate each of two X-points of the FRC magnetic field; and measure a distance between the two X-points to produce a length of the FRC magnetic field.

In embodiments, the spectro-polarimeter is further configured to: radially inject a second plurality of lasers into the FRC magnetic field; illuminate each of two X-points of the FRC magnetic field; and measure a distance between the two X-points to produce a length of the FRC magnetic field.

In embodiments, the spectro-polarimeter is configured to: image a wavelength of an FRC plasma along a horizontal axis direction of the CCD; image a radial extent of the FRC plasma along a vertical axis direction of the CCD; split light in the vertical direction into orthogonal polarizations using the birefringent crystal; and measure, using the CCD, a null location of an FRC magnetic field of the FRC plasma.

In embodiments, the spectro-polarimeter is further configured to: provide locations of the null location of the FRC magnetic field at two points along a diameter of the FRC plasma; calculate, using the locations of the null location, a radius and center of the FRC plasma; and provide the radius and center to a feedback control system.

In embodiments, the feedback control system controls a radial location and size of the FRC plasma by controlling the externally applied magnetic field.

Embodiments of the present disclosure are directed to a system for non-perturbative measuring of magnetic fields in high-temperature plasmas, comprising a first spectro-polarimeter and a second spectro-polarimeter, wherein the first spectro-polarimeter is configured to align a slit of the first spectropolarimeter toward an axial direction of the FRC plasma; and measure a location of a first X-point of the FRC magnetic field; wherein the second spectro-polarimeter is configured to simultaneously align a slit of the second spectropolarimeter toward an axial direction of the FRC plasma; measure a location of a second X-point of the FRC magnetic field; and measure a distance between the first X-point and the second X-point to produce a length of the FRC magnetic field.

All features, elements, components, functions, and steps described with respect to any embodiment provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and steps from different embodiments, or that substitute features, elements, components, functions, and steps from one embodiment with those of another, even if the following description does not explicitly state, in a particular instance, that such combinations or substitutions are possible. Express recitation of every possible combination and substitution is overly burdensome, especially given that the permissibility of each and every such combination and substitution will be readily recognized by those of ordinary skill in the art upon reading this description.

In many instances, entities are described herein as being coupled to other entities. It should be understood that the terms "coupled" and "connected" or any of their forms are used interchangeably herein and, in both cases, are generic to the direct coupling of two entities without any non-negligible e.g., parasitic intervening entities and the indirect coupling of two entities with one or more non-negligible intervening entities. Where entities are shown as being directly coupled together, or described as coupled together without description of any intervening entity, it should be understood that those entities can be indirectly coupled together as well unless the context clearly dictates otherwise.

While the embodiments are susceptible to various modifications and alternative forms, specific examples thereof have been shown in the drawings and are herein described in detail. It should be understood, however, that these embodiments are not to be limited to the particular form disclosed, but to the contrary, these embodiments are to cover all modifications, equivalents, and alternatives falling within the spirit of the disclosure. Furthermore, any features, functions, steps, or elements of the embodiments may be recited in or added to the claims, as well as negative limitations that define the inventive scope of the claims by features, functions, steps, or elements that are not within that scope.

What is claimed:

1. A non-perturbative method of measuring radially varying axial magnetic fields in high-temperature plasmas, comprising:
    radially injecting from one or more light sources a first plurality of laser beams into a Field-Reversed-Configuration (FRC) plasma and perpendicular to an FRC magnetic field confining the FRC plasma, wherein the one or more light sources being external to the FRC plasma and each of the first plurality of laser beams has a different polarization, wherein each of the first plurality of laser beams crossing
    a null magnetic field location in the FRC magnetic field of the FRC plasma at two radial locations as each of the first plurality of laser beams radially crosses the FRC magnetic field;
    collecting scattered light signals from plasma atoms illuminated by the first plurality of laser beams, wherein the scattered light signals are collected in a viewing direction perpendicular to the injected paths of the first plurality of laser beams and one of radially or axially to the FRC magnetic field; and
    determining the null magnetic field location of the FRC magnetic field of the FRC plasma from the collected scattered light signals as a function of a linear polarization fraction, $p_L$, of the collected scattered light signals, wherein the linear polarization fraction, $p_L$, of a collected light signal being $$p_L = \frac{1}{\sqrt{1+4H^2}}$$

when collected in a viewing direction axial to the FRC magnetic field, or $$p_L = \frac{1+2H^2}{1+6H^2}$$

when collected in a viewing direction radial to the FRC magnetic field, wherein where $H=\omega_p/A$ is the ratio Larmor frequency of bound electron and Einstein's coefficient or radiation rate of the ion.

2. The method of claim 1, further comprising:
    axially injecting a second plurality of laser beams into the FRC plasma in a direction parallel to the FRC magnetic field, wherein each of the second plurality of laser beams crossing the null magnetic field location in the FRC magnetic field of the FRC plasma at two axial locations adjacent opposing axial edges of the FRC magnetic field as each of the second plurality of laser beams axially crosses the FRC magnetic field,
    collecting scattered light signals from plasma atoms illuminated by the second plurality of lasers, wherein the scattered light signals are collected in a viewing direction perpendicular to the injected paths of the second plurality of laser beams and radially to the FRC magnetic field;

determining first and second axial null magnetic field locations of the FRC magnetic field of the FRC plasma from the collected scattered light signals as a function of a linear polarization fraction, $p_L$, of the collected scattered light signals, wherein the linear polarization fraction, $p_L$, of a collected light signal being $$p_L = \frac{1+2H^2}{1+6H^2};$$

and measuring a distance between the first and second axial null magnetic field locations to produce a length of the FRC magnetic field.

3. The method of claim 1, further comprising:

radially injecting a second and a third plurality of laser beams into the FRC plasma in a direction perpendicular to the FRC magnetic field at first and second axial locations, respectively, adjacent first and second opposing axial edges of the FRC magnetic field;

collecting scattered light signals from plasma atoms illuminated by the second and third plurality of lasers, wherein the scattered light signals are collected in a viewing direction perpendicular to the injected paths of the second and third plurality of laser beams and one of radially and axially to the FRC magnetic field;

determining first and second axial null magnetic field locations of the FRC magnetic field of the FRC plasma from the collected scattered light signals as a function of a linear polarization fraction, $p_L$, of the collected scattered light signals, wherein the linear polarization fraction, $p_L$, of a collected light signal being $$p_L = \frac{1}{\sqrt{1+4H^2}}$$

when collected in a viewing direction axial to the FRC magnetic field, or $$p_L = \frac{1+2H^2}{1+6H^2}$$

when collected in a viewing direction radial to the FRC magnetic field; and measuring a distance between the first and second axial null magnetic field locations to produce a length of the FRC magnetic field.

4. The method of claim 1, further comprising:

determining locations of the null magnetic field of the FRC magnetic field at two points along a diameter of the FRC plasma;

calculating, using the locations of the null magnetic field, a radius and a center of the FRC plasma; and providing the radius and center to a feedback control system.

5. The method of claim 4, wherein the feedback control system controls a radial location and size of the FRC plasma by controlling the externally applied magnetic field.

6. The method of claim 1, wherein the step of collecting scattered light signals from plasma atoms comprising:

aligning a slit of a first spectropolarimeter in a viewing direction perpendicular to the injected paths of the first plurality of laser beams and one of radially or axially to the FRC magnetic field of the FRC plasma;

collecting scattered light signals from plasma atoms illuminated by the first plurality of lasers through the slit; and determining the null magnetic field location of the FRC magnetic field of the FRC plasma from the collected scattered light signals as a function of the linear polarization fraction, $p_L$, of the collected scattered light signals.

7. The method of claim 1, wherein the step of collecting scattered light signals from plasma atoms comprising:

simultaneously aligning first and second slits of first and second spectropolarimeters in a viewing direction perpendicular to the injected paths of a second and third plurality of laser beams and one of radially or axially to the FRC magnetic field of the FRC plasma;

collecting scattered light signals from plasma atoms illuminated by the second and third plurality of lasers through the first and second slits;

determining a location of first and second axial null magnetic field locations of the FRC magnetic field from the collected scattered light signals as a function of the linear polarization fraction, $p_L$, of the collected scattered light signals; and measuring a distance between the first and second axial null magnetic field locations to produce a length of the FRC magnetic field.

8. The method of claim 1, further comprising:

determining locations of the null magnetic field of the FRC magnetic field at two points along a diameter of the FRC plasma;

calculating, using the locations of the null magnetic field, a radius and a center of the FRC plasma; and providing the radius and center to a feedback control system.

9. The method of claim 8, wherein the feedback control system controls a radial location and size of the FRC plasma by controlling the externally applied magnetic field.

10. A system for non-perturbative measuring of radially varying axial magnetic fields in high-temperature field reversed configuration (FRC) plasmas, comprising:

a first spectro-polarimeter comprising a spectrometer having a fast imaging Charged Coupled Device (CCD) camera; and a first light source positioned external to an FRC plasma and configured to radially inject a first plurality of laser beams into an FRC plasma and perpendicular to an FRC magnetic field confining the FRC plasma, wherein the FRC magnetic field is a radially varying axial magnetic field, wherein each of the first plurality of laser beams has a different polarization, wherein the first light source is configured to inject each of the first plurality of laser beams along a path crossing a null magnetic field location in the FRC magnetic field of the FRC plasma at two radial locations; wherein the spectrometer is configured to collect scattered light signals from plasma atoms illuminated by the first plurality of lasers beams in a viewing direction perpendicular to the injected paths of the first plurality of laser beams and one of radially or axially to the FRC magnetic field; and, wherein a null magnetic field location of the FRC magnetic field of the FRC plasma is determinable from the collected scattered light signals as a function of a linear polarization fraction, $p_L$, of the collected scattered light signals, wherein the linear polarization fraction, $p_L$, of a collected light signal being $$p_L = \frac{1}{\sqrt{1+4H^2}}$$

when collected in a viewing direction axial to the FRC magnetic field, or $$p_L = \frac{1+2H^2}{1+6H^2}$$

when collected in a viewing direction radial to the FRC magnetic field, wherein $H=\omega_p/A$ is the ratio Larmor frequency of bound electron and Einstein's coefficient or radiation rate of the ion, and a plurality of slits each aligned with individual ones of the plurality of lasers beams to collect and image scattered light signals from plasma atoms illuminated by the plurality of lasers beams.

11. The system of claim 10, wherein the first plurality of laser beams have similar wavelengths and are separated by a small distance from each other; and further comprising:

a birefringent crystal to split the scattered light signals into orthogonal polarizations pairs of the scattered light signals; and a plurality of slits in the spectro-polarimeter, wherein each of the plurality of slits aligned with individual ones of the plurality of lasers beams to collect and image pairs of the orthogonal polarized scattered light signals with the CCD; and wherein the CCD is further configured to determine the null magnetic field location of the FRC magnetic field of the FRC plasma from the collected scattered light signals as a function of a linear polarization fraction, $p_L$, of the collected scattered light signals.

12. The system of claim 10, further configured to:

axially inject the second plurality of laser beams into the FRC plasma in a direction parallel to the FRC magnetic field, wherein each of the second plurality of laser beams crossing a null magnetic field location in the FRC magnetic field of the FRC plasma at two axial locations adjacent opposing axial edges of the FRC magnetic field as each of the second plurality of laser beams axially crosses the FRC magnetic field, collect scattered light signals from plasma atoms illuminated by the second plurality of lasers, wherein the scattered light signals are collected in a viewing direction perpendicular to the injected paths of the second plurality of laser beams and radially to the FRC magnetic field;

determine first and second axial null magnetic field locations of the FRC magnetic field of the FRC plasma from the collected scattered light signals as a function of a linear polarization fraction, $p_L$, of the collected scattered light signals, wherein the linear polarization fraction, $p_L$, of a collected light signal being $$p_L = \frac{1+2H^2}{1+6H^2};$$

and measure a distance between the first and second axial null magnetic field locations to produce a length of the FRC magnetic field.

13. The system of claim 10, further configured to:

radially inject a second and a third plurality of lasers into the FRC plasma in a direction perpendicular to the FRC magnetic field at first and second axial locations, respectively, adjacent first and second opposing axial edges of the FRC magnetic field;

collecting scattered light signals from plasma atoms illuminated by the second and third plurality of lasers, wherein the scattered light signals are collected in a viewing direction perpendicular to the injected paths of the second and third plurality of laser beams and one of radially and axially to the FRC magnetic field;

determining first and second axial null magnetic field locations of the FRC magnetic field of the FRC plasma from the collected scattered light signals as a function of a linear polarization fraction, $p_L$, of the collected scattered light signals, wherein the linear polarization fraction, $p_L$, of a collected light signal being $$p_L = \frac{1}{\sqrt{1+4H^2}}$$

when collected in a viewing direction axial to the FRC magnetic field, or $$p_L = \frac{1+2H^2}{1+6H^2}$$

when collected in a viewing direction radial to the FRC magnetic field; and measure a distance between the first and second axial null magnetic field locations to produce a length of the FRC magnetic field.

14. The spectro-polarimeter of claim 10, further configured to:

determine locations of the null magnetic field of the FRC magnetic field at two points along a diameter of the FRC plasma;

calculate, using the locations of the null magnetic field, a radius and a center of the FRC plasma; and provide the radius and center to a feedback control system.

15. The spectro-polarimeter of claim 14, wherein the feedback control system controls a radial location and size of the FRC plasma by controlling the externally applied magnetic field.

16. The system of claim 10, further comprising:

a second spectro-polarimeter comprising a spectrometer having a fast imaging CCD camera; and a second light source positioned external to an FRC plasma and configured to axially inject a second plurality of laser beams into the FRC plasma in a direction parallel to the FRC magnetic field, wherein the second light source is configured to inject each of the second plurality of laser beams along a path crossing a null magnetic field location in the FRC magnetic field of the FRC plasma at two axial locations adjacent opposing axial edges of the FRC magnetic field, wherein the spectrometer is configured to collect scattered light signals from plasma atoms illuminated by the second plurality lasers beams in a viewing direction perpendicular to the injected paths of the first plurality of laser beams and radially to the FRC magnetic field; and, wherein first and second null magnetic field locations adjacent the first and second opposing axial edges of the FRC magnetic field of the FRC plasma are determinable from the collected scattered light signals as a function of a linear polarization fraction, $p_L$, of the collected scattered light signals, wherein the linear polarization fraction, $p_L$, of a collected light signal being $$p_L = \frac{1+2H^2}{1+6H^2}.$$

17. The system of claim 10, further comprising:
second and third spectro-polarimeters each comprising a spectrometer having a fast imaging CCD camera; and
second and third light sources positioned external to an FRC plasma and configured to radially inject second and third plurality of lasers into the FRC plasma in a direction perpendicular to the FRC magnetic field at first and second axial locations, respectively, adjacent first and second opposing axial edges of the FRC magnetic field along a path crossing a null magnetic field location in the FRC magnetic field of the FRC plasma adjacent opposing axial edges of the FRC magnetic field, wherein each spectrometer of the second and third spectro-polarimeters is configured to collect scattered light signals from plasma atoms illuminated by the second and third plurality lasers beams in a viewing direction perpendicular to the injected paths of the second and third plurality of laser beams and one of radially and axially to the FRC magnetic field; and, wherein first and second null magnetic field locations adjacent the first and second opposing axial edges of the FRC magnetic field of the FRC plasma are determinable from the collected scattered light signals as a function of a linear polarization fraction, $p_L$, of the collected scattered light signals, wherein the linear polarization fraction, $p_L$, of a collected light signal being $$p_L = \frac{1}{\sqrt{1+4H^2}}$$

when collected in a viewing direction axial to the FRC magnetic field, or $$p_L = \frac{1+2H^2}{1+6H^2}$$

when collected in a viewing direction radial to the FRC magnetic field.

* * * * *

UNITED STATES PATENT AND TRADEMARK OFFICE
CERTIFICATE OF CORRECTION

| | | |
|---|---|---|
| PATENT NO. | : 11,011,354 B2 | Page 1 of 1 |
| APPLICATION NO. | : 16/204434 | |
| DATED | : May 18, 2021 | |
| INVENTOR(S) | : Gupta et al. | |

It is certified that error appears in the above-identified patent and that said Letters Patent is hereby corrected as shown below:

On the Title Page

In item (54), "NON-PERTUBATIVE" should be replaced with "NON-PERTURBATIVE".

In the Specification

In Column 1, Lines 1-3, "NON-PERTUBATIVE" should be replaced with "NON-PERTURBATIVE".

In Column 1, Line 19, "non-pertubative" should be replaced with "non-perturbative".

In Column 2, Line 33, "non-pertubative" should be replaced with "non-perturbative".

In Column 2, Lines 39-40, "non-pertubative" should be replaced with "non-perturbative".

In Column 2, Line 44, "non-pertubative" should be replaced with "non-perturbative".

In Column 3, Line 40, "non-pertubative" should be replaced with "non-perturbative".

In Column 4, Lines 4-5, "non-pertubative" should be replaced with "non-perturbative".

In Column 4, Line 9, "non-pertubative" should be replaced with "non-perturbative".

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*